(12) United States Patent
Posseme et al.

(10) Patent No.: US 10,336,023 B2
(45) Date of Patent: Jul. 2, 2019

(54) METHOD FOR CREATING PATTERNS

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Stefan Landis, Tullins (FR); Lamia Nouri, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/538,594

(22) PCT Filed: Dec. 22, 2015

(86) PCT No.: PCT/EP2015/081090
§ 371 (c)(1),
(2) Date: Jun. 21, 2017

(87) PCT Pub. No.: WO2016/102628
PCT Pub. Date: Jun. 30, 2016

(65) Prior Publication Data
US 2018/0001582 A1    Jan. 4, 2018

(30) Foreign Application Priority Data
Dec. 22, 2014 (FR) .................... 14 63153

(51) Int. Cl.
*B29D 11/00* (2006.01)
*B81C 99/00* (2010.01)
(Continued)

(52) U.S. Cl.
CPC ...... *B29D 11/00365* (2013.01); *B81C 1/0046* (2013.01); *B81C 1/00103* (2013.01);
(Continued)

(58) Field of Classification Search
None
See application file for complete search history.

(56) References Cited

U.S. PATENT DOCUMENTS

| 3,997,367 A | 12/1976 | Yau |
| 6,207,517 B1 | 3/2001 | Mueller |

(Continued)

FOREIGN PATENT DOCUMENTS

| DE | 29 11 726 A1 | 10/1979 |
| FR | 2 449 971 | 9/1980 |
| WO | 2014/102222 A1 | 7/2014 |

OTHER PUBLICATIONS

International Search Report dated Mar. 17, 2016 in PCT/EP2015/081090 filed Dec. 22, 2015.
(Continued)

*Primary Examiner* — Stephanie P Duclair
(74) *Attorney, Agent, or Firm* — Oblon, McClelland, Maier & Neustadt, L.L.P.

(57) ABSTRACT

The invention relates in particular to a method for creating patterns in a layer (410) to be etched, starting from a stack comprising at least the layer (410) to be etched and a masking, layer (420) on top of the layer (410) to be etched, the masking layer (420) having at least one pattern (421), the method comprising at least:
a) a step of modifying at least one zone (411) of the layer (410) to be etched via ion implantation (430) vertically in line with said at least one pattern (421);
b) at least one sequence of steps comprising:
b1) a step of enlarging (440) the at least one pattern (421) in a plane in which the layer (410) to be etched mainly extends;
b2) a step of modifying at least one zone (411', 411") of the layer (410) to be etched via ion implantation (430) vertically in line with the at least one enlarged
(Continued)

pattern (421), the implantation being carried out over a depth less than the implantation depth of the preceding, modification step;

c) a step of removing (461, 462) the modified zones (411, 411', 411"), the removal comprising a step of etching the modified zones (411, 411', 411") selectively with respect to the non-modified zones (412) of the layer (410) to be etched.

34 Claims, 9 Drawing Sheets

(51) Int. Cl.
| | |
|---|---|
| *G02B 3/00* | (2006.01) |
| *H01L 21/3065* | (2006.01) |
| *H01L 21/308* | (2006.01) |
| *H01L 21/311* | (2006.01) |
| *H01L 21/768* | (2006.01) |
| *B81C 1/00* | (2006.01) |
| *C23C 14/04* | (2006.01) |
| *C23C 14/48* | (2006.01) |
| *C23C 14/58* | (2006.01) |
| *G02B 3/02* | (2006.01) |
| *G03F 7/00* | (2006.01) |

(52) U.S. Cl.
CPC .......... *B81C 99/009* (2013.01); *C23C 14/042* (2013.01); *C23C 14/48* (2013.01); *C23C 14/5853* (2013.01); *C23C 14/5873* (2013.01); *G02B 3/0025* (2013.01); *G02B 3/0031* (2013.01); *G02B 3/02* (2013.01); *G03F 7/0002* (2013.01); *H01L 21/308* (2013.01); *H01L 21/3065* (2013.01); *H01L 21/31111* (2013.01); *H01L 21/31116* (2013.01); *H01L 21/76804* (2013.01); *H01L 21/76817* (2013.01); *B81B 2203/0376* (2013.01); *B81C 2201/0133* (2013.01); *B81C 2201/0136* (2013.01)

(56) References Cited

U.S. PATENT DOCUMENTS

| | | | | |
|---|---|---|---|---|
| 6,326,300 | B1* | 12/2001 | Liu | H01L 21/31116 257/E21.248 |
| 7,790,621 | B2* | 9/2010 | Wen | H01L 21/32134 438/745 |
| 2001/0000159 | A1 | 4/2001 | Muller | |
| 2012/0264307 | A1* | 10/2012 | Kundalgurki | H01L 21/02057 438/705 |
| 2012/0276658 | A1* | 11/2012 | Godet | H01L 21/30612 438/3 |
| 2014/0342557 | A1 | 11/2014 | Diem | |
| 2016/0035581 | A1 | 2/2016 | Posseme et al. | |

OTHER PUBLICATIONS

H. Ottevaere et al., "Comparing glass and plastic refractive microlenses fabricated with different technologies", Journal of Optics A: Pure and Applied Optics, vol. 8, Issue 7, 2006, 23 pages.

Yung-Chun Lee et al., "Spherical and Aspheric Microlenses Fabricated by Excimer Laser LIGA-like Process", Journal of Manufacturing Science and Engineering, vol. 129. No. 1, Jun. 26, 2006, Abstract only, 2 pages.

* cited by examiner

PRIOR ART

PRIOR ART

PRIOR ART

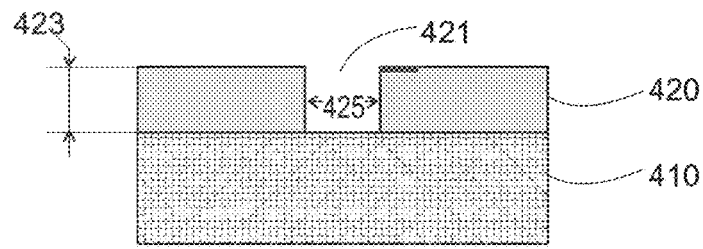
Figure 4a
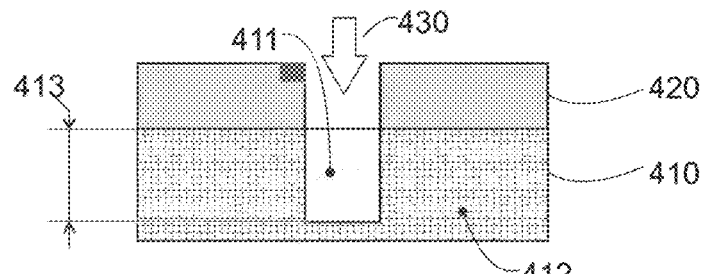
Figure 4b
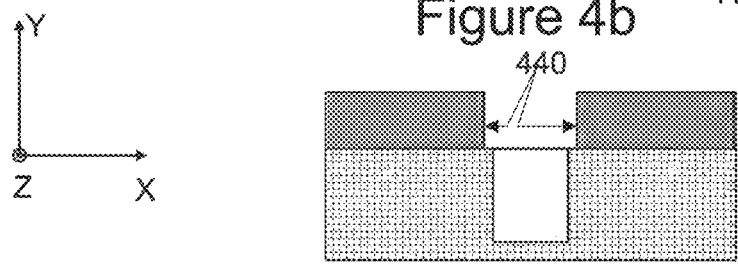
Figure 4c
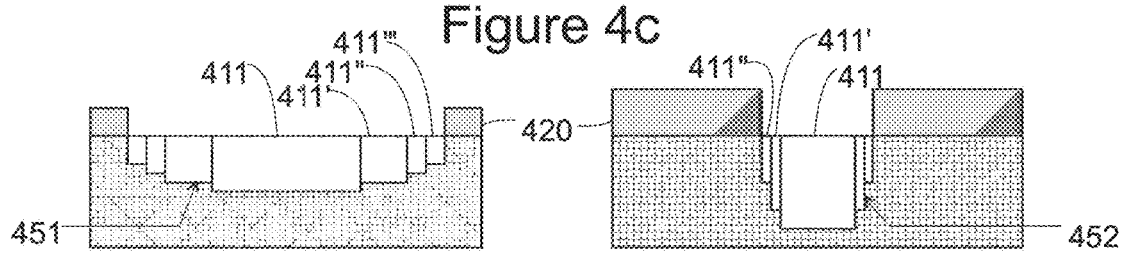
Figure 4d    Figure 4g
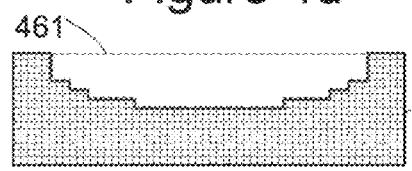    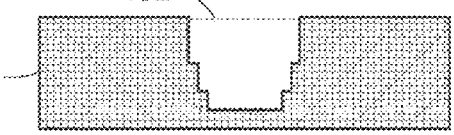
Figure 4e    Figure 4h
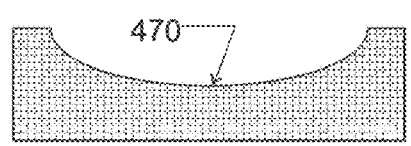    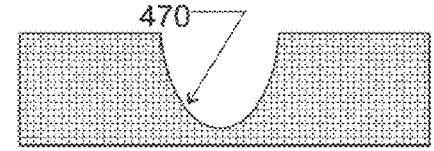
Figure 4f    Figure 4i

| Ion | Substrate | Dose (atom/cm2) | Energy (keV) | Tilt(°) | Rp | ΔRp |
|---|---|---|---|---|---|---|
| He | Si100 | 1.00e+16 | 1 | 7 | 15 | 20 |
| He | Si100 | 1.00e+16 | 2 | 7 | 30 | 34 |
| He | Si100 | 1.00e+16 | 7 | 7 | 94 | 94 |
| He | Si3N4(100) | 1.00e+15 | 2 | 7 | 21 | 11 |
| N2 | Si100 | 1.00e+16 | 1 | 7 | 7 | 5 |
| N2 | Si100 | 1.00e+16 | 2 | 7 | 12 | 8 |
| Ar | Si100 | 1.00e+15 | 3 | 7 | 8 | 7 |
| Ar | Si100 | 1.00e+15 | 30 | 7 | 50 | 36 |
| Ar | Si3N4(100) | 1.00e+15 | 20 | 7 | 19 | 7 | etc.

METHOD FOR CREATING PATTERNS

TECHNICAL FIELD OF THE INVENTION

The invention relates in general to the creation of structures in the field of the methods used by the microelectronics industry to manufacture all sorts of systems, of a micrometric or nanometric size, possibly combining electronic, optical and mechanical components.

More specifically, it relates to the methods in which patterns must be aligned with respect to other patterns previously created.

The invention has a particularly advantageous use in the creation of aspherical microlenses intended for light collection, imaging, and light guide uses. It also has an advantageous use in the creation of structures called "dual damascene" structures for the vertical interconnection of metal lines in particular made of copper.

PRIOR ART

For numerous uses, it is necessary to create patterns aligned with other patterns previously defined during previous operations of photolithography and etching.

The constant reduction in the dimensions of the patterns thus presents the difficulty of being able to actually align the patterns with enough accuracy during successive photolithography operations.

This problem is particularly important for the creation of matrices of microlenses used in numerous optoelectronic devices. In this field, there are already numerous manufacturing methods. A review of known techniques for manufacturing microlenses can, be found, for example, in the following publication in English; *Journal of Optics A: Pure and Applied Optics* 8, issue 7, pages 407-429, published in 2006.

Among them, microjet printing and thermal reflow are henceforth highly advanced techniques that are used in the industry in order to create microlenses having high optical quality. However, these techniques are more qualitative than quantitative when there is a need to achieve a predetermined surface profile intended to confer the expected optical properties on the lenses. For example, thermal reflow of photoresin and microjet printing are based on the tensions of surfaces which highly limits the choice of the surface profiles that can be obtained in practice with these techniques.

Other known techniques such as laser ablation, two-photon polymerisation and direct laser writing allow a very large choice of profile of surfaces to be obtained, but are sequential techniques that require each lens of a matrix to be made individually. As a result, these techniques are not usable on an industrial scale in terms of cost and yield.

More recently, the techniques of moulding and printing such as those generally designated by the names hot embossing, imprinting and injection moulding have been used a lot in order to create microlenses. The manufacturing principle, illustrated by FIG. 1, which consists of FIGS. 1a and 1b, is to fill a mould 100 with a malleable material, typically a polymer, and then detach 130 the latter from the moulded material 120. FIG. 1b shows that the microlenses obtained in this way can have hemispherical 140 and aspherical 150 shapes. According to the type of substrate 110 on which the moulding is carried out, made of silicon or of quartz, the uses could relate, respectively, to the range of the wavelengths of the infrared (IR) or that of visible light.

The methods for manufacturing via imprinting require having moulds that can themselves be manufactured for example using the techniques cited in the publication mentioned above (Journal of Optics). As a general rule, the standard techniques implemented by the microelectronics industry are most often preferred since they are very reliable and the integration of the microlenses into the final components, typically electronic components such as a transistor, is facilitated because of this. FIG. 2, consisting of FIGS. 2a to 2c, illustrates an example of mould manufacturing. As shown in FIG. 2a, after the deposition of a layer 102 of a thermal oxide of silicon (SiO2) or silica, for example having a thickness of 20 micrometers (μm), on a wafer such as those routinely used in the microelectronics industry, that is to say, a silicon wafer 103 having a large diameter, for example a diameter of 8 inches, a layer 101 of silicon nitride (Si3N4), for example having a thickness of 350 nanometers, is deposited on the layer of thermal oxide. The patterns 104 intended to form the reliefs of the mould are first etched in the layer of nitride 101 using conventional lithography steps (FIG. 2a). The wafer is then immersed in a wet etching solution, for example a solution containing hydrofluoric acid (HF). As shown in FIG. 2b, the mask of nitride protects the zones of the wafer in which the etching solution must not attack the layer of silica 102. The etching of the layer of silica 102 is isotropic, thus forming a cavity in the shape of a portion of a sphere centred on the patterns 104. In the following step illustrated in FIG. 2c, the mask of nitride is removed and after applying an anti-adhesive treatment, the wafer can be used as a mould 100 for the imprinting.

Optionally, the patterns in relief of the mould can be created directly in the silicon 103 without having to use the intermediate layer of silica 102. In this case, the etching solution is a mixture of hydrofluoric acid (HF) and nitric acid (HNO3) as reported in 2009 in an article that appeared in the English-language review Optics Express, Volume 17, Issue 8, pages 6283 to 6292 (2009).

Although the mould manufacturing methods briefly described above are suitable for obtaining, as shown, spherical or hemispherical patterns, it is difficult to obtain lenses called aspherical lenses having desired shapes with these methods. The production of matrices of aspherical micro lenses is generally required, however, in many uses. These aspherical lenses indeed usually have much better optical properties. In particular, spherical lenses, contrary to aspherical lenses, lead to optical aberrations, and the rays passing through the centre of the lens do not converge at exactly the same point as those passing through the edges. This causes blurring at large apertures and an increase in the size of the focused spot that cannot be ignored in most uses.

It is thus necessary to use lasers and the techniques called laser machining or laser ablation, already mentioned above, which are the only ones capable of creating the complex profiles necessary, with the major disadvantage, however, that each micro lens must then be made individually. These techniques are described, for example, in the article "Spherical and Aspheric Microlenses Fabricated by Excimer Laser LIGA-like Process", Yung-Chun Lee, Chun-Ming Chen and Chun-Ying Wu, which was published in 2006 in the English-language review *Journal of Manufacturing Science and Engineering*, 129, 126-134.

In general, there is no method that is simple, fast, that is to say, which can be carried out in a single series of steps on the scale of a wafer, is also compatible with the standard techniques of microelectronics and allows the surface profile to be controlled simply in order to produce matrices of aspherical lenses in particular.

Another way to approach the problem of creating complex profiles, like those necessary for the production of aspherical lenses and also for uses other than optics, involves being able to create three-dimensional (3D) structures in the shape of steps of a staircase, that is to say, having a plurality of discrete levels of heights as illustrated in FIG. 3, which consists of FIGS. 3a to 3e. In the case of the production of matrices of micro lenses, it is therefore possible to approximate the desired profiles using a number of steps that is more or less large.

The standard method that allows the creation of these 3D structures in the shape of steps of a staircase is complicated and requires a significant number of steps as is illustrated in FIG. 3. It must be possible to repeat, according to the number of steps of a staircase to be created, this number being 4 in the example of FIG. 3, a series of lithography and etching steps, shown by FIGS. 3a to 3f, which can be difficult to implement for critical dimensions 312 of patterns to be created, typically less than one pm, and for large aspect ratios 322, typically greater than 3.

A particular difficulty involves being able to accurately align the successive patterning steps with respect to each other. In particular, after each etching of the substrate 310, it is necessary to redeposit a layer of resin 320 and reform a pattern aligned with the preceding pattern. Thus, the patterns 321', 321", 321''' must all be aligned with the pattern 321.

If it is not possible to align the corresponding photolithography operations with each other very accurately, etching artefacts 330 can be obtained such as that shown in FIG. 3e which is a photograph made using a scanning electron microscopy apparatus on a four-level 3D structure similar to those in the preceding drawings. The presence of such defects is obviously highly disadvantageous and no longer allows the desired final profile to be obtained.

One object of the present invention is therefore to propose a method that applies to a wafer for the production of profiles and that allows at least some of the problems mentioned above to be eliminated or at least limited.

In particular, the purpose of the present invention is to propose a simple and reliable solution for obtaining a profile using operations of lithographies that must be self-aligned, while providing good size control.

The other objects, features and advantages of the present invention will be clear from an examination of the following description and the accompanying drawings. It is understood that other advantages can be incorporated.

SUMMARY OF THE INVENTION

To achieve this goal, one aspect of the present invention relates to a method for creating patterns, in a layer to be etched, starting from a stack comprising at least the layer to be etched and a masking layer on top of the layer to be etched, the masking layer having at least one pattern, the method comprising at least;
   a) a step of modifying at least one zone of the layer to be etched via ion implantation vertically in line with the at least one pattern;
   b) at least one sequence of steps comprising:
      b1) a step of enlarging the at least one pattern in a plane in which the layer to be etched mainly extends;
      b2) a step of modifying at least one zone of the layer to be etched via ion implantation vertically in line with the at least one enlarged pattern, the implantation being carried out over a depth less than the implantation depth of the immediately preceding modification step;
   c) a step of removing the modified zones, the removal comprising a step of wet etching the modified zones selectively with respect to the non-modified zones of the layer to be etched.

Moreover, the masking layer is a hard mask or the stack comprises a buffer layer positioned between the masking layer and the layer to be etched and covering the layer to be etched during the implantation.

Thus, the invention allows, in particular because of the step of enlarging the initial pattern present in a masking layer that is preserved and the implantation step, a plurality of modified zones that are automatically aligned with each other to be defined, Indeed, the masking layer is preserved above the layer to be etched without being completely removed between two implantations. Said masking layer is preserved after the modification step in order to carry out the enlarging step. The successive patterns used for the successive implantations are thus formed in the initial masking layer and via successive enlargements of an initial pattern present in this initial masking layer. Consequently, all these patterns are self-aligned.

Moreover, the method according to the invention prevents atoms of carbon present in the masking layer from being torn away at the surface of the latter during the implantation and penetrating the layer to be etched. This would have the effect of modifying the surface of the layer to be etched, which would prevent the wet etching of the latter during the removal step. The layer to be etched would then not be etched or the patterns would not be accurately transferred into the layer to be etched. For this, in the method according to the invention, the masking layer is a hard mask or the stack comprises a buffer layer covering the layer to be etched during the implantation.

Moreover, this method is fast and perfectly suited to the industrial constraints in terms of productivity. In particular, the wet etching saves me while providing good size control and a good surface state.

The invention thus allows a structure to be obtained, the profile of which does not have the alignment defects usually encountered with the known methods that require successive operations of lithographies.

The invention thus provides a simple and reliable solution for obtaining a profile that is possibly complex and has improved definition, optionally by repeating said sequence of steps b1) and b2) before step c).

Another object of the present invention relates to a method for creating a mould for forming aspherical lenses via nanoimprinting. The method comprises the steps a) to c) above and the sequence of steps b1) and b2) is repeated in such a way as to obtain a hollow, aspherical profile in the shape of steps of a staircase.

Another object of the present invention relates to a method for creating a dual damascene structure. The stack comprises an underlying layer below the layer to be etched. The method comprises the steps a) to c) above. The initial patterns of the masking layer have a profile similar to interconnection vias. The enlargement step b1) is carried out in such a way as to make at least some of the initial patterns connected. The step b2) is carried out in such a way that the implanted zone has a profile similar to an interconnection line. The profile obtained after step c) is then transferred into the underlying layer.

Another object of the present invention relates to microelectronic device made by implementing one of the methods according to the invention. Microelectronic device means any type of device made with means from microelectronics. In addition to the devices having a purely electronic purpose, these devices include, in particular, micromechanical or electromechanical devices (MEMS, NEMS . . . ) and optical or optoelectronic devices (MOEMS . . . )

BRIEF DESCRIPTION OF THE DRAWINGS

The goals, objects, features and advantages of the invention will be better understood from the detailed description of an embodiment of the invention that is illustrated by the following accompanying drawings in which:

FIG. 4, which consists of FIGS. 4a to 4i, describes the steps of an example of a method according to the invention that allows, for example, self aligned 3D structures in the shape of steps of a staircase to be created.

Figure 1A:
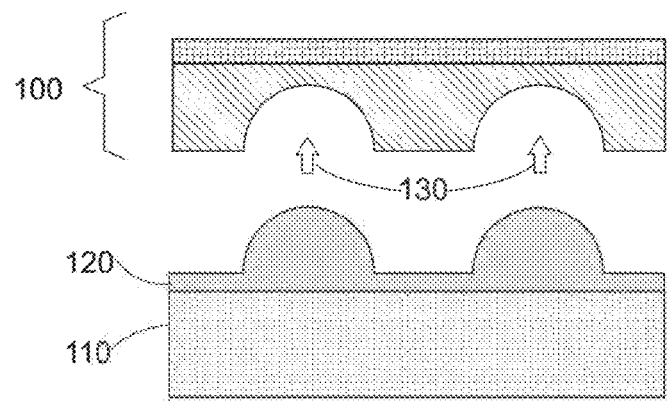
FIG. 1, which consists of FIGS. 1a and 1b, illustrates the principle of manufacturing, via moulding, lenses that are hemispherical or formed by a portion of a sphere.
Figure 1B:
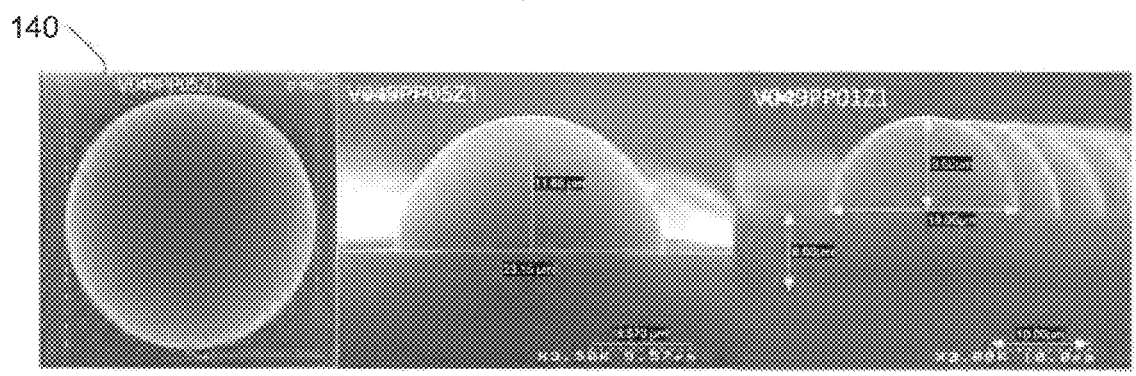
Figure 1B:
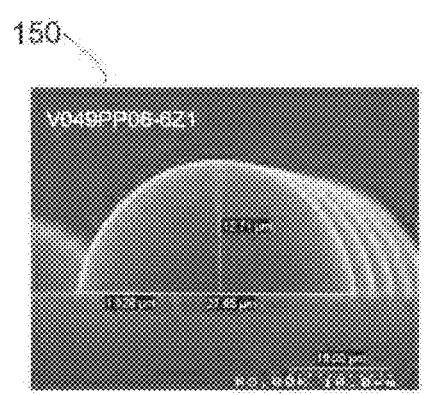
Figure 1B:
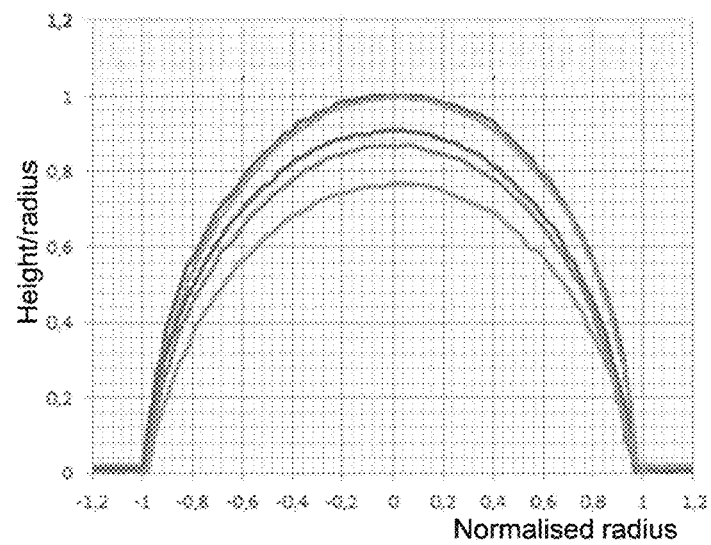
Figure 2A:
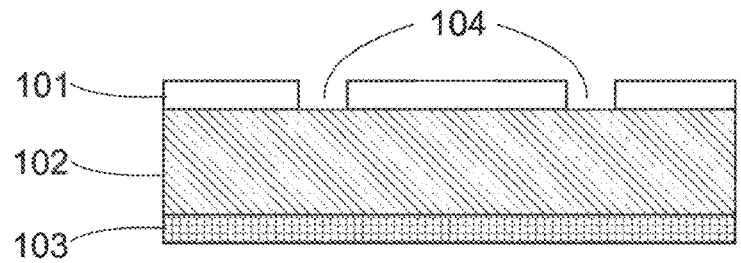
FIG. 2, which consists of FIGS. 2a to 2c, illustrates an example of manufacturing an imprinting mould carrying an imprint that forms a portion of a sphere.
Figure 2B:
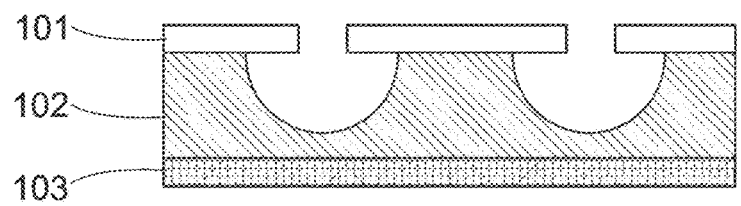
Figure 2C:
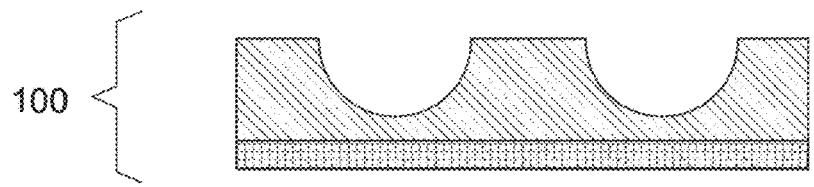

The drawings are given as examples and are not limiting to the invention. They are schematic representations of a principle, intended to facilitate the understanding of the invention, and are not necessarily on the scale of the practical applications. In particular, the relative thicknesses of the various layers and films are not representative of reality.

DETAILED DESCRIPTION OF THE INVENTION

Before starting a detailed review of embodiments of the invention, optional features that can optionally be used in combination or alternatively are listed below:

According to one embodiment, the step of enlarging the at least one pattern comprises anisotropic etching the masking layer, the main direction of which is parallel to a plane in which the layer to be etched mainly extends. This etching etches the masking layer selectively with respect to the layer to be etched.

The step of enlarging the at least one pattern of the masking layer does not etch the layer to be etched.

According to one embodiment, the stack comprises a buffer layer positioned between the masking layer and the layer to be etched.

According to one embodiment, the buffer layer covers the layer to be etched during the implantation.

Thus, the buffer layer remains above the layer to be etched during the step of modification via implantation, Thus, the elements of the masking layer that could tend to move in the direction of the layer to be etched under the effect of the implantation are stopped or trapped in the buffer layer. These elements, typically carbon from the masking layer made of resin, do not therefore reach the layer to be etched. During the etching of the modified zones of the layer to be etched, these elements do not disturb the etching, thus allowing very good size control of the patterns etched in the layer to be etched to be, achieved. Without the buffer layer, atoms of carbon present in the masking layer would be torn away from the surface of the latter during the implantation and would penetrate the layer to be etched which would prevent the etching of the latter during the removal step. The layer of silicon would therefore be non-etched or the patterns would not be transferred accurately into the layer to be etched.

According to one embodiment, the masking layer comprises carbon. For example, a resin. The thickness of the buffer layer, after the step of enlargement and before the implantation, is sufficient to form a barrier that prevents, during said implantation, carbon coming from the masking layer from penetrating into the layer to be etched.

According to one embodiment, the thickness of the buffer layer, after the step of enlargement and before the implantation, is at least 10 nm and preferably at least 20 m and preferably at least 30 nm.

According to an advantageous embodiment, the implantation is carried out on the whole plate, that is to say, over the entire surface of the stack.

According to another embodiment, the buffer layer (610) is made of a material taken from the following materials: SixOy, SiOx, SixNy, SiNx, TiN, SiARC.

Preferably, the buffer layer is made of a material taken from the following materials: SiO2, SiN, TiN, SiARC.

According to another embodiment, the material of the masking layer and the material of the buffer layer are different. The step of enlarging the at least one pattern of the masking layer comprises selective etching of the masking layer with respect to the buffer layer, the etching being preferably anisotropic etching, the main direction of which is parallel to a plane in which the layer to be etched mainly extends.

According to another embodiment, the masking layer and the buffer layer are made of resin.

According to another embodiment, the buffer layer forms a residue of resin at the bottom of the pattern of the masking layer. Advantageously, the buffer layer and the step of enlarging the at least one pattern are chosen in such a way as to preserve at least a portion of the buffer layer in order for it to entirely cover the layer to be etched after said at least one sequence and before said step of removing the modified zones.

According to one embodiment, the masking layer is positioned directly in contact with the layer to be etched.

According to one embodiment, the asking layer is a carbon layer.

The implantation is carried out with an implanter. Preferably, the thickness of the buffer layer is adjusted in such a way that in the modified zones, the ions are implanted continuously starting from the surface of the layer to be etched.

According to another embodiment, the masking layer is directly in contact with the layer to be etched.

According to an advantageous embodiment, the implantation is carried out in a plasma reactor. This has the advantage of being able to implant the ions continuously starting from the surface of the layer to be etched.

According to one embodiment, before said sequence of steps, a step of creating the at least one pattern in the masking layer is carried out.

The step of creating the at least one pattern in the masking layer comprises at least a step of lithography and a step of etching the masking layer.

According to one embodiment, the step of etching uses a solution of tetramethylammonium hydroxide (TMAH) or hydrofluoric acid (HF), preferably in an oxygen atmosphere. This etching allows very good selectivity of the zones modified by implantation with respect to the non-modified zones. Thus, the crystalline silicon of the layer to be etched is not at all or only slightly consumed by this type of cleaning, whereas the silicon made amorphous by the implantation is easily consumed.

According to an advantageous embodiment, before the steps a) to c), the pattern forms an opening through the entire thickness of the masking layer. Thus, the masking layer forms a mask carrying at least one pattern.

According to one embodiment, the layer to be etched is exposed vertically in line with the at least one pattern before the ion implantation. Thus, the implantation of the layer to be etched is carried out on the exposed layer to be etched.

According to another embodiment, the layer to be etched is not exposed during its implantation. Thus, the implantation in the layer to be etched is carried out through a residual thickness on top of the layer to be etched. This residual layer also on top of the layer to be etched is preferably the masking layer made of resin. This residual layer thus plays the same role as the buffer layer mentioned above. Thus, this embodiment with a residual thickness is advantageous in particular when the implantation is carried out using conventional beam implanter. Indeed, with such an implanter, it is difficult to implant on the surface. Providing a residual layer, for example of resin, allows this problem to be avoided and allows implanting over the entire desired thickness starting from the surface of the layer to be etched by adapting the implantation conditions and the thickness of the residual layer.

Thus, the implantation conditions and the thickness of the residual layer are adjusted in such a way that in the modified zones, the ions are implanted continuously starting from the surface of the layer to be etched.

According to one embodiment, the masking layer is a layer of resin. The resin is made from an organic or organo-mineral material that can be shaped by exposure to a beam of electrons, photons or X-rays or mechanically. The interest of using a resin is that it is easy to deposit a significant thickness of resin, from several hundred nanometers to several microns. The vertical consumption during the trimming step is not therefore a problem. Preferably, a non-carbon buffer layer is also used with the layer of resin. This buffer layer can, thus be, for example, made of SiOx or SiNx and more specifically made of SiO2 or SiN.

According to one embodiment, the buffer layer is a carbon layer, typically a layer of resin. It can be a residual thickness of the masking layer.

According to another embodiment, the masking layer is a layer forming a hard mask.

The hard mask is for example a non-carbon, inorganic hard mask, It can thus be, for example, made of SiOx or SiNx and more specifically made of SiO2 or SiN. It can also be a metal hard mask, for example made of TiN.

According to one embodiment, the masking layer is positioned directly in contact with the layer to be etched. The step of enlarging the at least one pattern of the masking layer comprises etching the masking layer selectively with respect to the layer to be etched, the etching being anisotropic etching, the main direction of which is parallel to a plane in which the layer to be etched mainly extends.

According to one embodiment, which the material of the hard mask is taken from SiOx, SiNy, SiARC and TiN.

Before the implantation of ions, the layer to be etched is exposed vertically in line with the at least one enlarged pattern.

Advantageously a hard mask is used to create patterns having small lateral dimensions thus requiring a small total opening in the mask and thus a small mask thickness.

According to an advantageous alternative, at least one protective layer is placed on the masking layer, the material of the protective layer being chosen in such a way as to prevent or reduce vertical consumption of the hard mask during the step of enlarging the pattern formed in the hard mask. In this embodiment, the material of the hard mask is preferably chosen out of SiOx and SiNy and wherein the material of the protective layer is the other out of SiOx and SiNy.

According to one embodiment, the thickness of the buffer layer is adjusted in such a way that in the modified zones, the ions are implanted continuously starting from the surface of the layer to be etched.

According to one embodiment, the implantation is carried out in a plasma reactor.

According to an advantageous embodiment, before the step c) of removing the modified zones, said sequence of steps b1) and b2) is carried out multiple times. preferably at least three times. Thus, during the successive steps of enlargement and implantation of the enlarged pattern, the trimming value of the masking layer and the depth of modification of the layer to be etched are adjusted at each step in order to obtain the desired profile.

According to an advantageous embodiment, steps b) and c) are chosen, in particular the enlarging of the at least one pattern and the implantation depth, in such a way that the modified zones form a profile in the shape of steps of a staircase.

According to an advantageous embodiment, after etching a profile in the shape of steps of a staircase in the layer to be etched, said profile is smoothed by oxidation and deoxidation of the material of the substrate.

According to an advantageous embodiment, the profile is the negative of a shape of an aspherical lens. Alternatively, the profile is in the shape of a spherical lens.

According to an advantageous embodiment, the profile forms a mould configured to penetrate an imprintable resin in order to transfer the profile into it via nanoimprinting.

According to an advantageous embodiment, before steps a) to c), the masking layer comprises a plurality of patterns and steps a) to c) are applied to said plurality of patterns.

According to an advantageous embodiment, before steps a) to c), the masking layer comprises a plurality of, patterns forming openings in the thickness of the masking layer, preferably passing through the masking layer, and the enlargement step is carried out in such a way as to remove the material of the masking layer, typically the resin, separating at least two patterns, in such a way as to make these at least two patterns connected after enlargement.

According to an advantageous embodiment, before steps a) to c), the masking layer comprises a plurality of patterns intended to form interconnection vias, the enlargement step being carried out in such a way as to connect at least some of the interconnection vias. The profile made in the layer to be etched has the shape of a dual damascene structure.

According to an advantageous embodiment the profile formed in the layer to be etched is then transferred into an underlying layer covered by the layer to be etched, the layer to be etched acting as a hard mask during the transfer of the profile into the underlying layer.

Preferably, the method comprises a step of tilling the profile obtained with a metal.

Advantageously, the profile obtained at the end of the method is a dual damascene structure.

According to an advantageous embodiment, the layer to be, etched is a layer or a substrate, the, material of which is taken from: silicon, silicon germanium, germanium, silicon nitride, sapphire, quartz the latter being crystalline contrary to glass.

According to another embodiment, the layer to be etched is a layer or a substrate made of SiOCH. The SiOCH can be porous or dense. This material has the advantage of having a very low permittivity, in particular when it is porous.

According to an advantageous embodiment, there is a protective layer on top of the layer to be etched made of SiOCH, located between the masking layer and the layer to be etched.

According to an advantageous embodiment, during the implantation, the protective layer is, vertically in line with the pattern, covered with a residue of masking layer forming a buffer layer, the thickness of which is smaller than the thickness of the masking layer outside of the pattern According to an advantageous embodiment, the layer to be etched is a crystalline layer.

The species below can be used in particular: hydrogen (H2) helium (He), argon (Ar) or nitrogen (N2).

In the context of the present invention, the methods known to a person skilled in the art and software (SRIM, TRIM, CTRIM . . . ) that allows the resulting implantation, and in particular the depth of implantation, to be simulated on the basis of the conditions of implantations (species implanted, material implanted, dose energy, time of exposure of the implanted layer to the beam of ions . . . ) can be used.

Advantageously, the implantation parameters, in particular the energy imparted on the ions, the time and the implantation dose are chosen in such a way that the implanted zones can be etched selectively with respect to the non-implanted zones. Preferably, these implantation parameters allow the matter to go from a crystalline state to an amorphous state.

Preferably, the implantation of species relates to all the elements that can be implanted in the material to be etched, without causing a dislocation of its atomic structure such that it would lead to an atomisation of the matter implanted, are capable of being suitable.

For example, the ions implanted are taken from hydrogen (H2), helium (He), argon (Ar) and nitrogen (N2). Just one or several of these species can be implanted.

According to one embodiment, the implantation is carried out anisotropically, in at least one implantation direction substantially perpendicular to the plane in which the layer to be etched or a substrate on which the layer to be etched is placed extends. In the drawings, the preferred direction of implantation is the direction Z.

It is specified that in the context of the present invention, the term "on", "is on top of", "covers" or "underlying" and the equivalents thereto do not mean "in contact with." Thus, for example, the deposition of a first layer on a second layer does not necessarily mean that the two layers are directly in contact with each other, but this means that the first layer at least partly covers the second layer while either being directly in contact with it or being separated from it by at least one other layer or at least one other element.

In the context of the present invention, the thickness of a layer is taken in a direction perpendicular to the main faces of the substrate on which the various layers rest. In the drawings, the thickness is taken in the direction Z indicated in the reference frame illustrated in FIG. 4c. In the drawings, the width of a pattern is taken in the direction X indicated in this same reference frame. The thickness is thus taken in a direction contained in the main plane in which the layer extends.

Likewise, when it is indicated that a zone is located vertically in line with a pattern, this means that the pattern and this zone are both located on the same line perpendicular to the main plane of the substrate, i.e. on the same line oriented vertically in the drawings.

In the context of the present invention, a three-dimensional (3D) pattern means a pattern having, in a given layer, for example a resin or a substrate, an analogue profile with a continuous variation of the tangents of the shape of the profile like in FIGS. 4e, 4h and 8 for example or having at least two levels of depth below the upper face of the layer when the pattern is hollow or at least two levels of height above an upper face of the layer when the pattern is protruding. A pattern called 2D pattern designates the particular case of a pattern only having two levels of height or depth.

FIG. 4, which consists of FIGS. 4a to 4i, describes the steps, of the method of the invention that allows the problems previously described in the prior art to be eliminated in order to create 3D structures in particular, for example profiles in the shape of steps of a staircase.

The method of the invention indeed allows the creation, via a succession of steps of ion implantation, of moulds having curved shapes controlled in order to obtain aspherical microlenses in particular. In a particularly advantageous manner, this is done using a single photolithography operation and while carrying out, before each implantation, a horizontal consumption of the layer of resin protecting the non-implanted zones in such a way as to extend, after each of these steps, the implanted zones. The implantations are possibly carried out under different conditions, in particular with different depths.

The operations of of horizontal etching or of horizontal consumption of the masking layer, for example made of resin, are qualified hereinafter with the term "trimming" widely used by the microelectronics industry in order to designate this type of adjustment of the horizontal dimensions of a pattern.

Figures 3A, 3B:
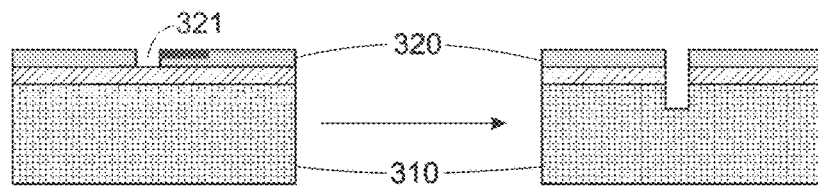
FIG. 3, which consists of FIGS. 3a to 3f, illustrates a conventional method for creating a three-dimensional (3D) structure in the shape of steps of a staircase.
Figures 3C, 3D, 3F:
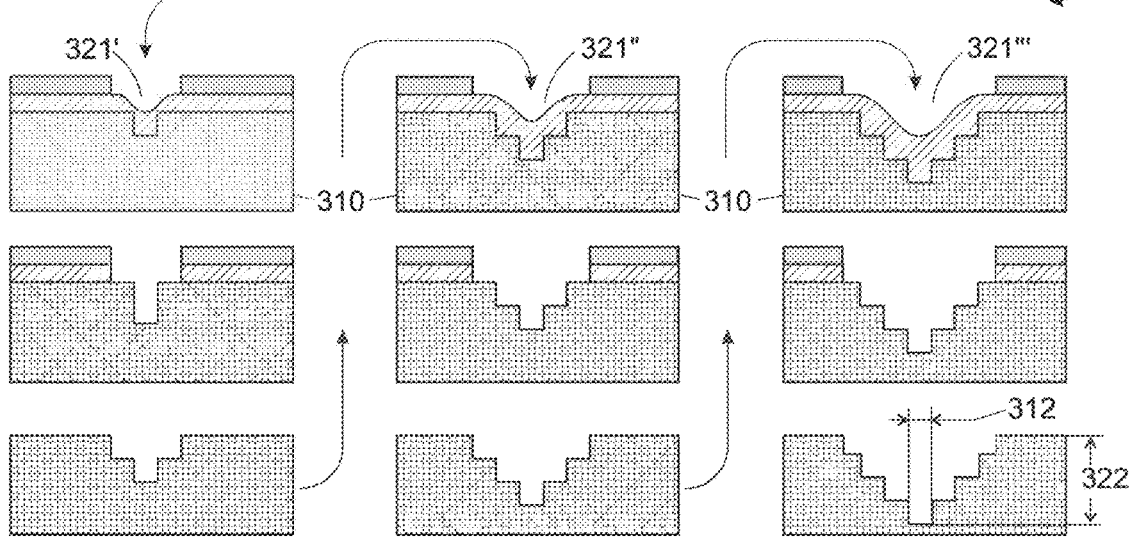
Figure 3E:
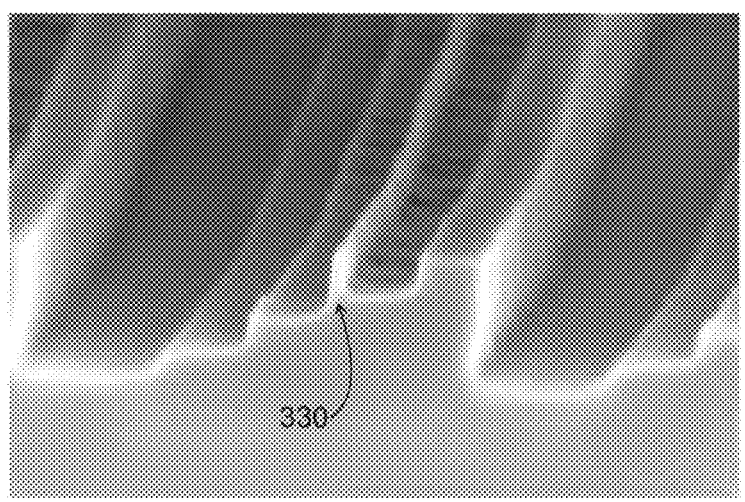

Precise control of the implantation conditions according to the conditions of trimming of the masking layer thus allows the optimal lens shapes for a given use to be obtained using a method that is not very costly. One major advantage of the method of the invention is indeed that it allows self-aligned structures to be obtained using a single initial photolithography step and thus at a lesser cost in comparison to the succession of independent photolithography steps of the conventional method in which the implanted surfaces must be realigned with each other at each step and with the disadvantages previously discussed in the description of FIG. 3.

As shown in FIG. 4a, at the start there is preferably a stack comprising at least one layer 410 to be etched and a masking layer 420 on top of the layer to be etched.

In the rest of the description, for reasons of conciseness and clarity, "substrate 410" designates this layer to be etched in which patterns will be formed. This term is not in any way limiting to the nature and the function of this layer. In an embodiment illustrated in FIG. 9 described below, it will be seen that the layer to be etched indeed acts as a hard mask. The terms "substrate", "layer to be etched" and "underlying layer" are thus equivalent.

The substrate 410 is for example made of silicon 410.

The masking layer 420 is a layer in which patterns can be formed by any one of the lithography methods.

In the following examples, described in reference to FIGS. 4 to 9, the masking layer 420 is a hard mask or a layer of resin, preferably associated with a buffer layer as will be described below.

According to one example of an embodiment, the masking layer 420 is formed from an imprintable or photosensitive resin.

More generally, a resin is an organic or organo-mineral material that can be shaped by exposure to a beam of electrons, photons or X-rays or mechanically. For example, mention can be made of resins conventionally used in microelectronics, the resins containing polystyrene (PS), methacrylate (for example PMMA Polymethyl methacrylate), Hydrosilsesquioxane (HSQ), polyhydroxystyrene (PHS) etc.

The masking layer 420 deposited on the substrate 410 has, according to this example of an embodiment, a thickness 423 from 100 nanometers (nm=$10^{-9}$ meter) to several microns (micron or µm=$10^{-6}$ meter). The thickness of this masking layer 420, for example made of resin, depends on the shape and the final critical dimensions (CD) of the desired structure and in particular on the number of steps of implantation and trimming required. The material of the masking layer 420 and its thickness are chosen in such a way that this deposited masking layer 420 not be to be totally consumed during the successive trimming steps. For example, if this masking layer 420 is made of resin and if the trimming consumes the resin substantially at the same rate, vertically and laterally, there needs to be a thickness of resin greater than the width (in the plane of the substrate) of the maximum opening that is desired to be made in this resin. Typically, the thickness of resin deposited is approximately 500 nm.

The definition of the initial patterns 421 in the resin 420 is done with conventional photolithography steps using, for example, insolation equipment operating in the ultraviolet (UV) that is to say such as: I-line 365 nm, DUV 248 nm, DUV 193 nm, or any other lithography technique, for example, electron-beam or e-beam, self-aligned or DSA, or nanoimprint lithography. The choice is made according to the complexity and the dimensions 425 of the initial patterns 421 to be formed.

If the masking layer 420 is a hard mask for example made of SiO2, SiN or TiN, the conventional techniques are also used to define the initial pattern that will then be enlarged after each implantation. Typically, a layer of resin is deposited on the masking layer 420 forming a hard mask, then an initial pattern is defined via photolithography in the resin before transferring this initial pattern into the masking, layer 420 forming a hard mask.

According to this embodiment of a profile in the shape of steps of a staircase, the distance to be created between two neighbouring patterns 421 must be at least greater than two times, the final enlargement generated, starting from the initial pattern, by all the trimming steps described below.

As shown in FIG. 4b, a first implantation 430 of any type of species that allows the state of the material of the layer 410 to be etched to be modified can then be carried out.

The implantation parameters, in particular the energy imparted on the ions, the time, and the implantation dose are chosen in such a xray that the implanted zones 411 care be etched selectively with respect to the non-implanted zones 412.

The implantation comprises implanting ions in the layer 410 to be etched without causing a dislocation of its atomic structure such that it would lead to an atomisation of the matter implanted.

According to a preferred embodiment, the implantation allows the substrate 411 to be made amorphous vertically in line with the initial patterns 421 that were defined in the masking layer 420.

Typically, as mentioned above, this is an implantation of ions using hydrogen (H2) that leads to a modification of the material of the zone 411. Argon (Ar), nitrogen (N2) or helium (He) can also be used.

The implantation is carried out anisotropically, preferably in at least one implantation direction substantially perpendicular to the plane in which the layer to be etched or a substrate on which the layer to be etched is placed extends. In the drawings, the preferred direction of implantation is the direction Z The masking layer 420 is preferably chosen in such a way that it prevents the modification of the layer 410 to be etched located vertically in line with the masking layer 420. Thus, the ions do not, pass through the masking layer 410 in order to penetrate the layer 410 to be etched.

According to one embodiment, the material of the masking layer prevents the ions from passing through it. According to another embodiment, it is the thickness of the masking layer that is adjusted in such a way that the ions remain trapped inside without penetrating the underlying layer to be etched.

Thus, the ions modify the layer 410 to be etched only vertically in line with the openings formed in the masking layer 420.

With regard to the implantation equipment, a plurality of choices are possible:
  for example, a dry etching reactor in which a plasma is formed can be used, and more particularly those called inductively or capacitively coupled reactors;
  or a conventional implanter called beam line implanter;
  or an immersion implanter that combines the two preceding techniques.

The choice of the implanter depends on the type of structure to be created and especially on the depth 413 to be implanted in the substrate.

If an etching reactor is used, the depth of implantation of the ions is limited to several tens of nanometers. Typically, the implantation can be carried out over a depth from several Angstroms ($10^{-10}$ meters) to a maximum of 100 nm. An implantation in which a CH4/He plasma, that is to say, methane/helium, is formed, in a proportion of these compounds of $1/50$, is preferred in this case since this type of plasma provides infinite etching selectivity with respect to the resin (no significant etching is observed during the implantation) if the masking layer 420 is made of resin. If hydrogen is used, it is observed that on the contrary, it chemically reacts with the resin and etches it during the implantation thus altering the dimensions 425 of the patterns previously defined via photolithography as seen above. Moreover, the advantage of using an etching reactor for the implantation is that the modification of the substrate, its amorphisation, is carried out without any discontinuities over the entire depth 413 implanted, that is to say, from the surface up to the maximum depth of the implanted zone. Thus, the cleaning step that follows and that is described below is very effective in removing all of the modified film.

With a conventional implanter, ions can be implanted to a greater depth, which can reach several hundred nanometers. Nevertheless, the disadvantage of conventional implanters lies in the fact that difficult to implant at the surface. Indeed, with conventional implanters, there minimum energy of approximately 1 keV (kilo electronvolt) that inevitably causes penetration of the ions implanted in the substrate. The ions are thus located at a distance from the surface of the latter, even if this is at a small depth. There is thus a zone between the surface and this depth that does not have any or has a very small concentration of implanted species. This does not therefore allow a surface modification, of approximately several nanometers, to be carried out.

The minimum implantation depth in these conditions is approximately 20 nm for hydrogen ions and 5 nm for an implantation using nitrogen.

The modification of the layer to be etched is not therefore carried out in a perfectly continuous manner starting from the surface of this layer.

Figure 5:
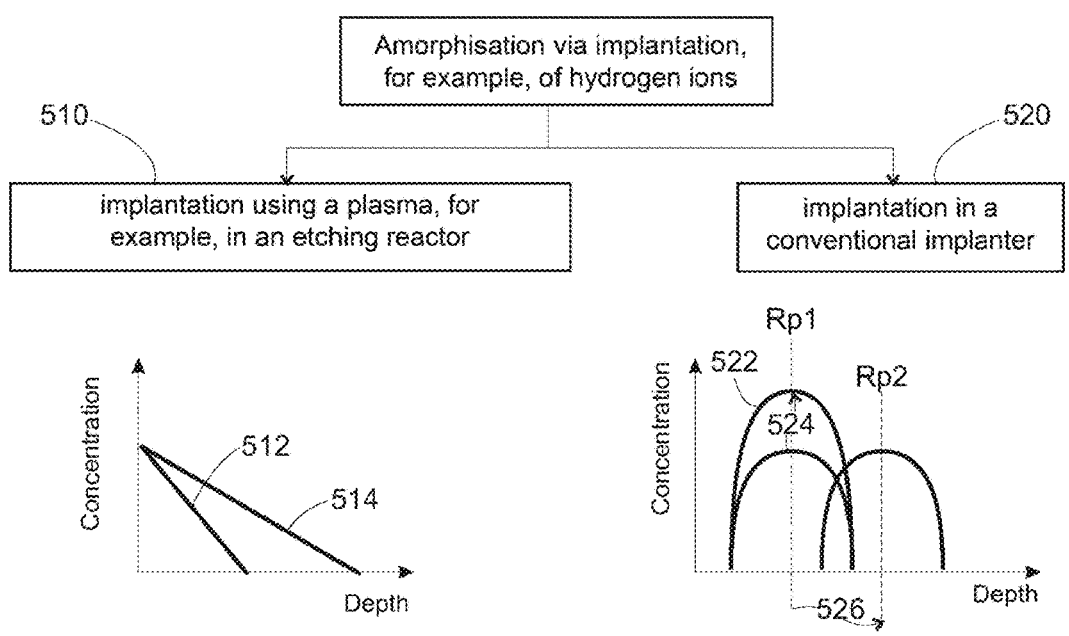
FIG. 5 compares the use of a conventional implanter and that of an etching reactor for the ion implantation operations implemented in the context of the invention.

For comparison, FIG. 5 shows implantation profiles of hydrogen ions obtained using a plasma in an etching reactor 510 and obtained in a conventional implanter 520. In the first case, it should be noted that the concentration of ions decreases linearly 512 from the surface at which it is thus the greatest. By adjusting the plasma in order for the ions to acquire a greater energy, greater depths are obtained, again with a decreasing linear profile 514.

In the case of a conventional implanter 520, the implantation is carried out around an average depth (Rp) at which the concentration is at a maximum with a Gaussian profile on either side 522. A plurality of implantations at different energies and thus different depths (Rp1, Rp2) must therefore be carried out in order to cover the entire thickness to be modified of the substrate. Greater doses allow the concentration 524 of the implanted ions to be increased. With the same dose, greater depths 526 are reached by imparting a greater energy on the ions. Conventionally, the dose expresses the number of atoms implanted in the matter per square centimeters.

Figure 7:
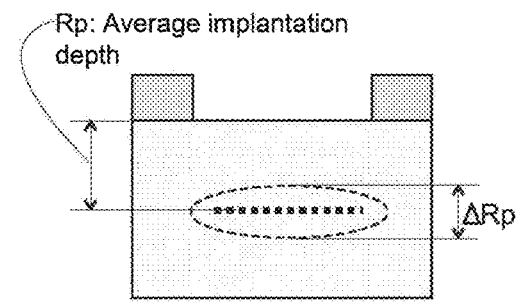
FIG. 7 presents examples of conditions of implantation in Si or SiN.

In the context of the present invention, the methods known to a person skilled in the art and software (SRIM, TRIM, CTRIM . . . ) that allows the resulting implantation, and in particular the depth of implantation, to be simulated on the basis of the conditions of implantations (species implanted, material implanted, dose, energy, time of exposure of the plate to the beam of ions etc.) can be used. FIG. 7 is an example describing various conditions of implantation in Si or Sin. In this drawing, Rp is the average implantation depth and delta Rp is the height of the implanted zone.

One solution allowing a conventional implanter to be used and thus allowing the problem of the low energies delivered by this type of equipment to be overcome is to add a "buffer layer" 610 between the masking layer 420, typically made of resin and the silicon substrate 410. This solution is described by FIG. 6 which consists of FIGS. 6a and 6b.

The thickness 613 of the buffer layer 610, which is at least 30 nm, thus allows implantation up to the surface of the substrate 410 even with ions accelerated with an energy of only 1 keV. In this type of reactor, the implantation is carried out at a given depth, labelled Rp as above. Around this depth Rp, the implantation zone typically extends over several tens of nanometers. In order to obtain continuous modification of the substrate, from its surface to the desired depth, it is thus necessary to ensure that the modified depths of the substrate overlap after each implantation step.

Thus, during the implantation of the layer to be etched made for example from silicon, the buffer layer 610 covers the layer 410 to be etched.

Other advantages related to the presence of this buffer layer 610 during the implantation will be detailed below in reference to the FIGS. 4 showing the various steps of the method for forming the patterns in the layer to be etched.

In the example of FIG. 6, the buffer layer 610 is made of SiARC, an anti-reflective material routinely used in lithography. In this case, it has a thickness 613 of 100 nm for an implantation in the silicon forming the substrate that extends over a depth 413 of 350 nm.

Figure 6A:
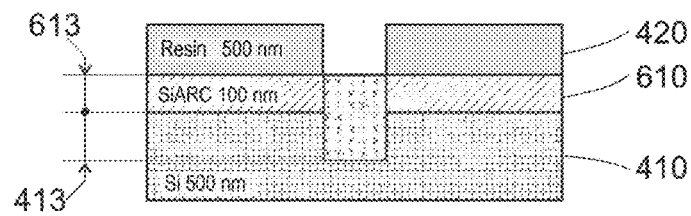
FIG. 6, which consists of FIGS. 6a and 6b, illustrates the use of a conventional implanter with the use of a buffer layer between the resin and the substrate to be implanted.
Figure 6B:
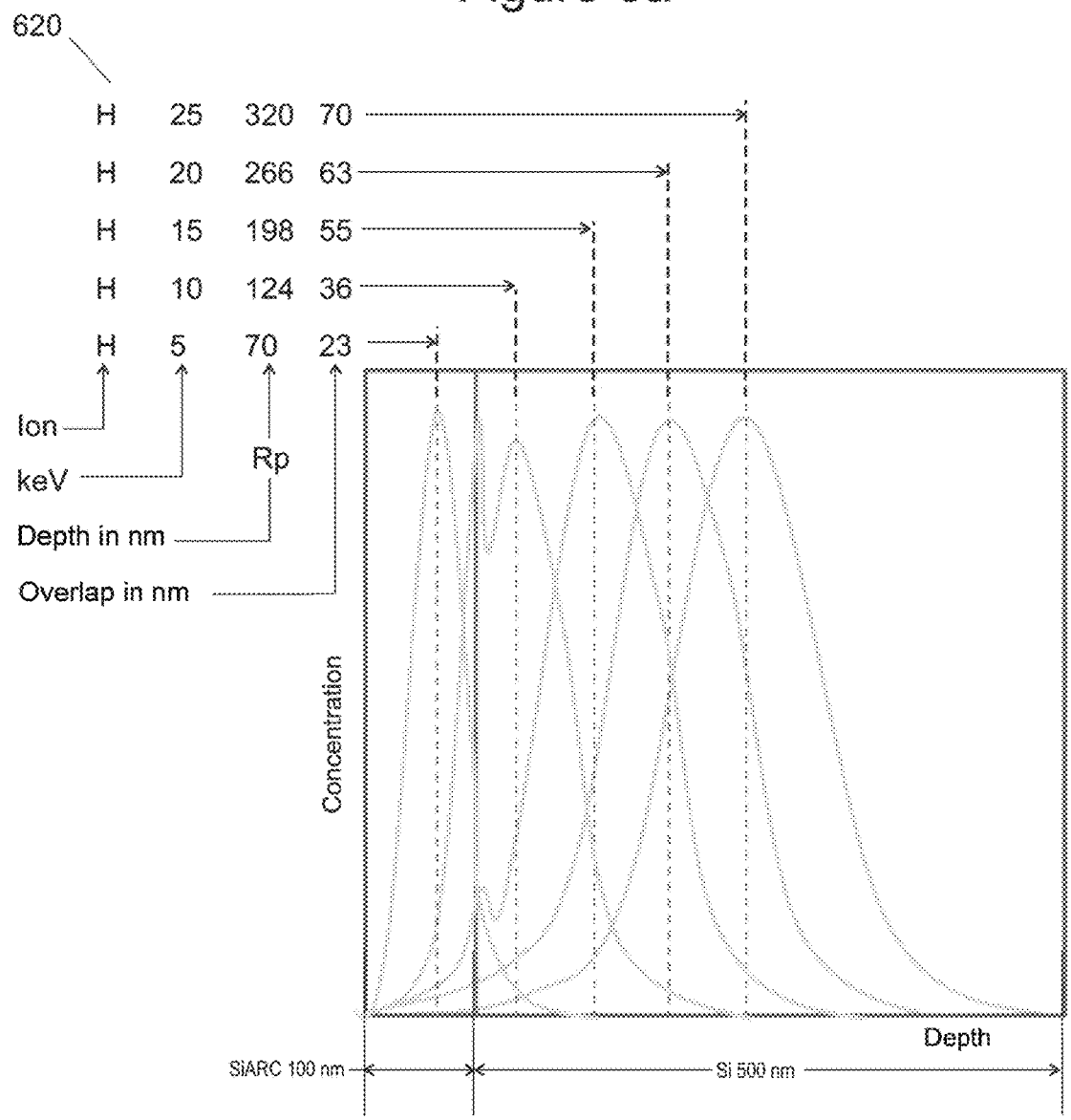

As can be seen in FIG. 6b, in this example, five successive implantations of hydrogen (H) ions with energies between 5 and 25 keV and the same dose of $10^{15}$ atoms/cm$^2$ are carried out. The conditions are calculated in order for there to be overlapping of the implantation profiles. The implantations are obtained at depths and with overlapping, as indicated in table 620. Other implantation conditions allow different implanted depths and different overlapping to be defined.

As mentioned above, the choice of an implanter can also relate to the use of a plasma via immersion which combines the two preceding techniques and which allows the implantation depth to be varied from several Angstroms to several hundred nanometers.

In reference again to FIG. 4, between two steps of implantation, a step of trimming 440 is carried out as illustrated in FIG. 4c, a step during which the horizontal dimensions of the initial pattern 421 are increased Thus, it is indeed the same masking layer 420 that is preserved between two implantation steps. Likewise it is indeed the pattern used during a first step of implantation that is enlarged before carrying out a second step of implantation. After implantation vertically in line with a pattern carried by the masking layer 420, there is therefore no removal of this masking layer 420 in order to redeposit another masking layer carrying another pattern. The same masking layer 420 is preserved and only the at least one pattern that it carries is enlarged.

Naturally, in general there is often a minimum of vertical consumption during the trimming step, in particular when the masking layer 420 is made of resin. The initial thickness of resin is thus chosen accordingly. For example, if the vertical attack rate is substantially equal to the lateral attack rate then the thickness of resin must be greater than the total trimmed width. This type of etching, which is routinely carried out in the microelectronics industry, is carried out in an inductively or capacitively coupled etching reactor using chemistry based on hydrogen bromide and oxygen (HBr/O2) or chlorine and oxygen (Cl2/O2). The flow rate of oxygen allows the trimming rate that is to say the lateral consumption of resin to be controlled. For example, in an inductively coupled reactor and under the following conditions: pressure 10 milliTorr; power of the source 500 Watts; polarisation power 50 Watts and with 15% oxygen in the HBr/O2 mixture: a lateral consumption of the resin of 80 nm per minute is induced. In the same conditions and with a proportion of oxygen of 45% in the gaseous mixture, a lateral consumption of the resin of 120 nm per minute is induced.

It should be noted that if the implantation is carried out using a plasma via immersion, the trimming step can be carried out in the same reactor as that used for the implantation while using the chemistry previously described. The use of this type of reactor is thus of interest because the steps of implantation 430 and trimming 440 can be carried out in the same piece of equipment, thereby simplifying the method and reducing the costs of obtaining. The industrialisation of the method according to the invention is therefore facilitated because of this.

The preceding operations, trimming and implantation, can be repeated using the initial pattern 421 in order to obtain a profile of implantation of the ions in the substrate 410 in the shape of steps of a staircase 451 like that illustrated in FIG. 4d. By acting on the trimming and implantation conditions at each of the steps, profiles can be obtained with very different aspect ratios like that 452 illustrated via comparison in FIG. 4g.

In FIGS. 4d and 4g, the zones modified by implantation after each definition of a pattern in the masking layer 420 are labelled 411, 411', 411'', 411'''. Naturally, during the implantation of the zone 411', an upper portion of the zone 411 modified during the previous step of implantation is again implanted, the implantation being carried out on the whole plate. Likewise, during the implantation of the zone 411'', an upper portion of the zones 411 and 411' is again implanted.

According to the embodiment illustrated in FIGS. 6a, 6b and described above, the masking layer 420 is on top of a buffer layer 610.

According to one embodiment, the buffer layer 610 is made of a non-carbon material, for example such as SiARC (anti-reflective coating), SixOy (SiO2 for example) or SixNy (SiN for example), or a metal mask such as TiN. In this case, the masking layer 420 is preferably made of resin.

According to another embodiment, the buffer layer 610 is made of a carbon material such as resin. In this case, the masking layer 420 is preferably made of resin and the buffer layer 610 thus forms a residual thickness at the bottom of the pattern present in the masking layer 420. A particularly advantageous example of the creation of the initial pattern is, creation via nanoimprinting. This low-cost, fast technique also allows a residue at the bottom of a pattern, forming the buffer layer, to be accurately defined. This residue of resin, usually perceived as a disadvantage of nanoimprinting, is used here as a buffer layer that protects the layer 410 to be etched during the implantation.

As indicated above, this buffer layer 610 is not etched, or is not entirely etched, during the step, of enlarging, the pattern present in the masking layer 420 made of resin. Thus, this buffer layer 610 remains above the layer 410 to be etched after enlargement of the pattern present in the masking layer 420. The layer 410 to be etched is therefore not exposed during the implantation.

This embodiment provides a considerable advantage. Indeed, it was noted that the implantation 430 in the absence of a buffer layer, in particular through a carbon layer such as a layer of resin, leads to a phenomenon that reduces the size control of the shape obtained in the end and reduces the quality of the, material of residual of the layer 410 to be etched.

More precisely, in the absence of a buffer layer, when the masking layer is a carbon layer, the desired implantation in the layer to be etched inevitably produces a bombardment of the surface of the masking layer. This masking layer is thus atomised on the surface. This bombardment tends to radiate atoms of carbon initially present in the carbon masking layer. A portion of these atoms of carbon are projected into the layer to be etched in the locations where it is exposed. In the context of the development of the present invention, was noted that these atoms of carbon penetrate the layer to be etched and thus form, in this layer, a surface film rich in carbon. This film generally has a thickness of less than 20 nm and more often less than 10 nm, according to the energy of the bombardment.

Thus, the exposed surface of the layer to be etched is modified by addition of carbon. Because of this modification of the surface of the layer to be etched, it is then no longer possible to correctly etch the implanted zone via wet etching.

Indeed, wet etching with a solution of tetramethylammonium hydroxide (TMAH) or hydrofluoric acid (HF), for example, does not allow the zones modified by implantation to be removed if they have been enriched with carbon. It follows that the patterns of the masking layer are not faithfully reproduced in the layer to be etched. In particular, the sides of the patterns of the layer to be etched are not located vertically in line with those of the masking layer. Moreover, the sides of the patterns of the layer to be etched are not vertical.

The size control of the complex shape to be created and the quality of the residual material are thus highly degraded.

In a more extreme case, the etching solution is not able to etch the layer of silicon to be etched if the surface of the latter is too rich in carbon.

The invention, by providing a buffer layer 610 that prevents the layer 420 to be etched from being exposed vertically in line with the enlarged portion of the pattern defined in the masking layer 420, the layer 420 to be etched is protected from any addition of carbon. Indeed, during the implantation, the carbon radiated at the bottom of the pattern is implanted in the buffer layer. The thickness of the latter is chosen in such a way that the atoms of carbon do not pass through it. The buffer layer thus stops and traps the atoms of carbon.

For example, if the buffer layer 610 is made of resin, a thickness, before implantation, preferably greater than 20 m and preferably greater than 30 nm is enough. The same is true if the buffer layer 610 is made of SixOy, SixNy or if it is a metal mask. In these latter cases, the buffer layer 610 has a thickness, before implantation, preferably greater than 20 m.

Since this buffer layer 610 must cover the layer 410 to be etched during the various sequences each comprising (1) a step enlarging the initial pattern and (2) a step of implantation, if this buffer layer tends to be etched during the step (1) of enlargement, naturally a sufficient initial thickness must be provided. For example, for a buffer layer 610 made of resin, if a thickness of the 5 nm is etched at each enlargement step and 10 sequences each comprising (1) a step enlargement and (2) a step of implantation are to be carried out, a thickness of the buffer layer 610 of at least 70 nm must be initially provided in order for there to remain at least 20 nm of resin above the layer 410 to be etched during the implantation of the tenth sequence.

The buffer layer 610 covering the layer 420 to be etched is removed, for example during the etching of the latter.

Because of this buffer layer 610, the sides of the patterns of the layer 420 to be etched are vertical. The size control of the complex shape created and the quality of the residual material are greatly improved.

Another embodiment that allows the addition of carbon into the layer to be etched to be prevented and thus allows the size control of the final patterns to be improved comprises the use of a masking layer 420 forming a non-carbon hard mask instead of a carbon masking layer.

This can be an inorganic hard mask, for example made of SiOx or SiNx and more particularly made of SiO2 or SiN. This can also be a metal hard mask, for example made of TiN.

Since this hard mask is not carbon, it does not radiate atoms of carbon into the layer 420 to be etched during the implantation. A film rich in carbon is not therefore formed on the surface of this layer.

These two embodiments, using a buffer layer 610 and a hard mask, have the advantage of allowing removal of the modified zones of the layer to be etched via TMAH.

One advantage of wet etching is that of having better etching selectivity with the non-implanted portion than with other types of etching in particular via plasma. Etching via plasma is indeed much more aggressive because of the bombardment. The invention allows better size control of the complex shape created and better quality of the residual material to be obtained.

In the following step, when the desired profile has been obtained, the masking layer 420 is removed. This step is perfectly known and mastered by a person skilled in the art. When the masking layer 420 is made of resin, its removal is conventionally carried out in an etching chamber using chemistry based on oxygen or via a wet process using chemistry that is routinely used, called SPM(H2SO4: H2O2), containing sulphuric acid (H2SO4) and oxygenated water (H2O2).

FIGS. 4e and 4h illustrate the result of the following step in which the entire zone 461, 462 of the substrate that was modified, that is to say, most often amorphised, via the successive operations of ion implantation is removed.

The conditions of removal of the modified zones, 461 and 462, are chosen in such a way that there is no or little consumption of the non-modified zones 412 of the substrate 410, that is to say, with a consumption of the non-modified material that does not exceed several nanometers per minute. Typically, if the substrate 410 is made of crystalline silicon, the silicon amorphised by the implantations is removed selectively with respect to the crystalline silicon, using a solution of tetramethylammonium hydroxide (TMAH) or hydrofluoric acid (HF) in an oxygen atmosphere. The crystalline silicon is not at all or only slightly consumed by this type of cleaning.

FIGS. 4f and 4i illustrate the result of a smoothing of the profiles in the shape of steps of a staircase that can be carried out after the previous step of removing the amorphised silicon. Thermal oxidation of the silicon of the substrate is then carried out in order to form a layer of oxide in a thickness range for example from 10 nm to 2 μm. This operation of growing thermal oxide is followed by deoxidation and cleaning for example via a wet process in a solution of hydrofluoric acid (HF). This step advantageously allows smoothing of the walls of the profile thus formed to be obtained and/or allows its final dimensions to be more precisely adapted.

This profile is for example suitable for forming a mould, one possible use of which is the creation of an aspherical lens via nanoimprinting.

An operation of smoothing the steps of a staircase can be carried out. This smoothing operation is preferably carried out via thermal oxidation followed by deoxidation. According to the thickness of silicon oxide that is desired to be created, the conditions of growth of this thermal oxide can be, for example, the following:

thermal oxidation having a thickness of 200 nm using annealing at 1000° C. in an oxidising atmosphere for 20 minutes;

thermal oxidation having a thickness of 1000 nm using annealing at 1000° C. in an oxidising atmosphere for 3 hours.

The removal of the SiO2 thus formed can be carried out via dissolution of the oxide via a wet process in a solution of hydrofluoric acid (HF) diluted to 10%.

FIG. 8 consisting of FIGS. 8a to 8d shows how to create a given profile by placing an embodiment of the invention.

Figure 8A:
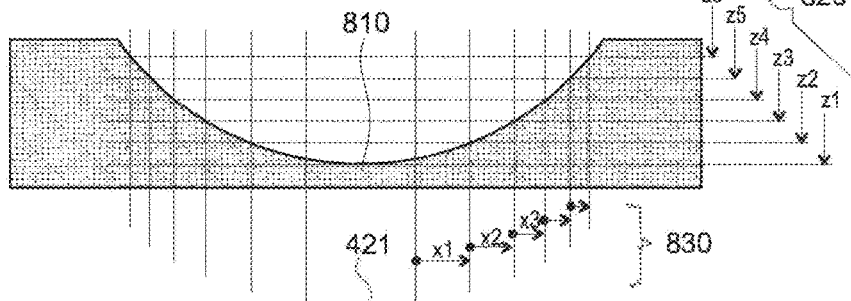
FIG. 8, which consists of FIGS. 8a to 8d, shows how to determine the number of steps of trimming the resin necessary in order to create a given profile.

The shape to be created with the method described with FIG. 4 is, for example, the shape 810 shown in FIG. 8a. It is considered that the user sets the number of steps of implantation to be carried out. In this example, the choice to carry out six steps of implantation is made. The shape to be created can thus be "fictitiously" cut up into the same number of different depths 820. This is done in sections having the same thickness or not, according to the implantation conditions chosen for each of the sections. The depths are labelled z1 z2, z3, z4, z5 and z6 in this example. These depths are taken along the direction Z. The intersection of these "fictitious" z planes with the shape 810 to be created allows the determination of the width of the various successive patterns necessary for each implantation, and thus of the dimensions 830 to be trimmed labelled here as x1, x2, x3, etc., with respect to the pattern 421 that must be defined by photolithography and initially etched into the masking layer 420 for example made of resin, as is already described in FIG. 4. The dimensions to be trimmed are taken along the direction X.

Figure 8B:
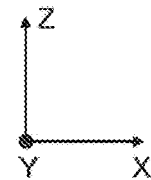
Figure 8B:
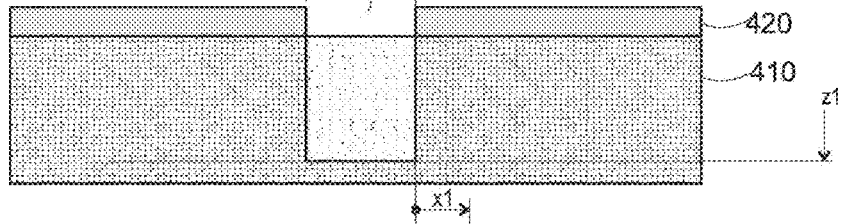
Figure 8C:
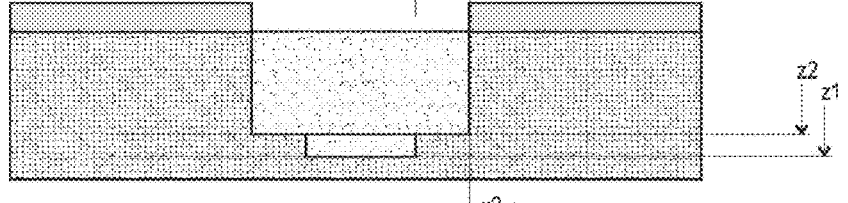
Figure 8D:
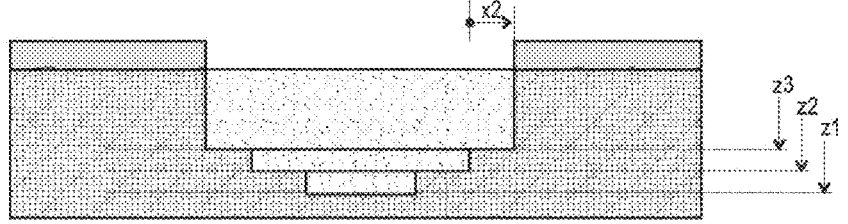

As illustrated in FIG. 8b; the pattern 421 allows modification via implantation of the substrate over the depth z1. As illustrated in FIG. 8c; the enlargement of the pattern 421 over a dimension x1 allows an enlarged pattern to be created. This enlargement is followed by a modification via implantation of the substrate over the depth z2. As illustrated in FIG. 8d; a new trimming operation allows the previous pattern to be enlarged over a dimension x2. This enlargement is followed by a modification via implantation of the substrate over the depth z3. The method can thus be continued by repeating this sequence of operations of trimming and implantation.

This procedure can be used to create any profile 810.

FIG. 9, which consists of FIGS. 9a to 9d, illustrates another use of the invention that is used in this example to create a "dual damascene" structure very widely used by the entire microelectronics industry since copper replaced aluminium for the interconnection of integrated circuits.

FIG. 9 shows the steps of creating an interconnection line that is advantageously in this case self aligned with the vertical contacts or visa (also called contact holes) intended to allow interconnection with the other interconnection planes located below (not shown in the drawings).

In the conventional approach, a dual damascene structure is created using a succession of steps involving: a first photolithography of the contact holes; dry etching of the contact holes by plasma; then, a second step of, photolithography of the line must be carried out, followed by a second step of dry etching of this line (also etching the contacts).

The invention allows a single photolithography step to be used in order to create this type of structure which is thus self aligned. The position of the vias with respect to the interconnection line is thus no longer dependent on the correct positioning of the second photolithography. The steps of the method, adapted to the creation of a dual damascene structure of this example of implementation of the invention, are those already described in the preceding drawings and repeated below.

Figure 9A:
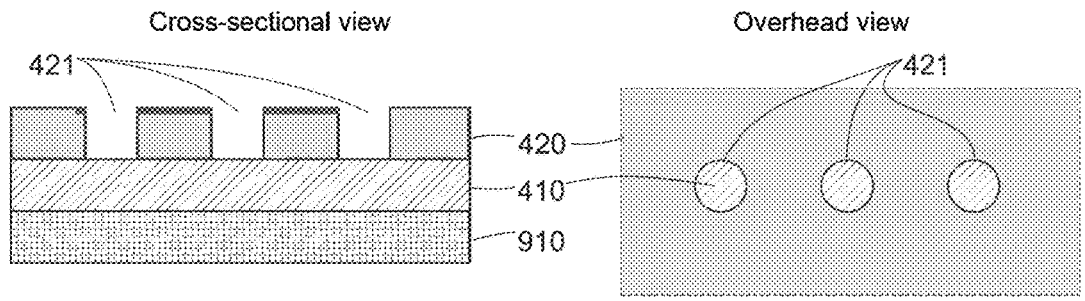
FIG. 9, which consists of FIGS. 9a to 9d, illustrates another use of the invention that is used in this example in order to create a self aligned "dual damascene" structure.

As shown in a FIG. 9a, which comprises a cross-sectional view on the left and an overhead view on the right, a layer of resin 420 is first deposited on a layer 410 of a material intended to form a hard mask. In this embodiment, the layer to be etched is the hard mask 410.

Then, a step of photolithography of the contact holes 421 in the resin 420 is carried out.

Preferably, the layer of resin 420 has a thickness equivalent to the thickness of the hard mask formed from the layer 410 to be etched, that is to say, from several tens to several hundred nanometers.

The hard mask 410 is then used to transfer the dual damascene structure into an underlying substrate 910. The hard mask 410 is for example formed out of silicon nitride such as Si3N4 or more generally SiNx or SixNy. The hard mask can also be of the SixOy or SiOx type. It can also be a metal mask such as TiN. Routinely used, silicon nitride is preferably chosen for a transfer into an underlying substrate 910 for example made of a semiconductor material such as silicon or an insulating material such as SiO2 or SiOCH.

Figure 9B:
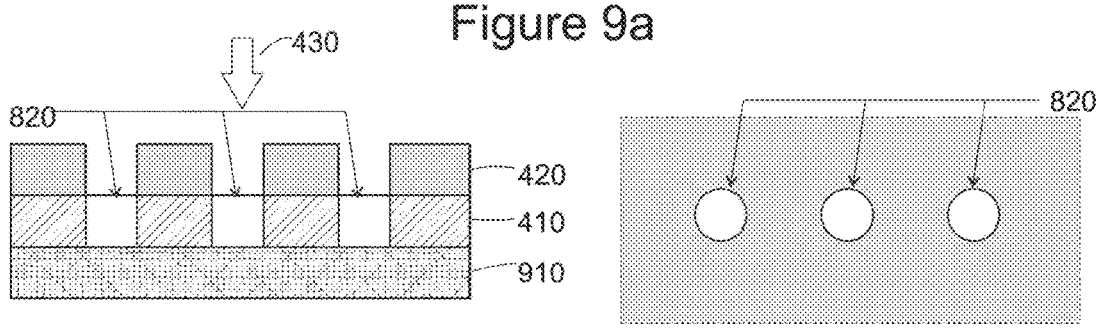

The transfer of the contact holes 421 into the hard mask 410 is then carried out via ion implantation 430 as described above. As shown in FIG. 9b, this step of implantation 430 reproduces the shape and the rate of repetition of the contacts 820, of which there are three in this example, via modification of the material forming the hard mask 410. The implantation conditions depend on the thickness of the hard mask 410 to be implanted.

Figure 9C:
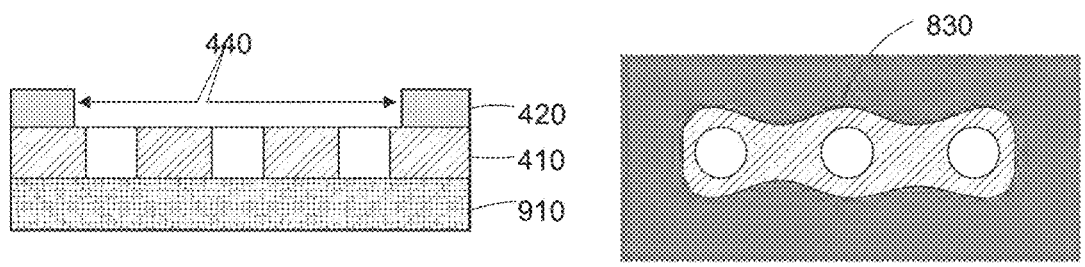

Then, as shown in FIG. 9c, the creation of the line 830 for interconnection of the three contacts of this example is first carried out by making the contact holes 421 made in the resin 420 become connected.

This is carried out, as above, via an operation of trimming 440, that is to say, via horizontal consumption of the resin 420 for example in a plasma containing oxygen without an additional photolithography operation.

Figure 9D:
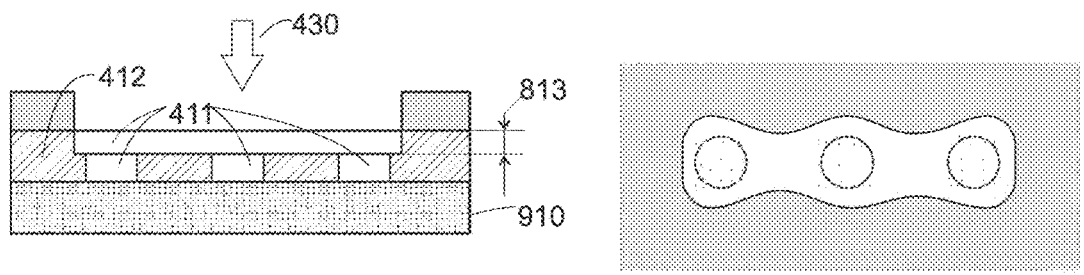

As shown in FIG. 9d, the imprint of the line 830 is then partly transferred into the thickness of the hard mask 410. In order to do this, a new operation of implantation 430 that is adapted in order to only modify an upper portion 813 of the layer forming the hard mask 410 is carried out. The implantation 430 is then obtained by using the various techniques previously mentioned, the implantation conditions depend in particular on the thickness that is chosen to form the layer 410 forming the hard mask.

The last step, not shown in FIG. 9, involves first removing the resin 420 by using the conventional techniques developed by the microelectronics industry, for example via a wet process in an acid solution or via a dry process in a plasma.

Then, the zones 411 of the hard mask 410 that were modified by ion implantation, that is to say, the contact holes and their interconnection line, are etched selectively with respect to the zones 412 of the hard mask 410 that remained non-modified. This can be carried out via a wet process or via a dry process. Preferably, the hard mask is silicon nitride, wet cleaning in a solution of hydrofluoric acid (HF) diluted to 1% is chosen.

The profile formed in the hard mask 410 can then be transferred into the underlying substrate 910.

In the examples described above in reference to FIGS. 3 to 9, it was indicated that the masking layer 420 is made of resin. In an alternative embodiment that can be applied to all the examples described above, the masking layer 420 is formed by a hard mask.

Advantageously, a hard mask is used to create patterns having small lateral dimensions thus requiring a small total opening in the mask and thus a small mask thickness.

The hard mask is for example made of SiOx or SiNx.

Advantageously in order to create wider patterns, the mask can be protected from vertical etching. For this, one or more protective layers can be provided on the layer acting as a mask. For example, a mask of SiOx can be protected by a layer of SiNy having a very small thickness (typically from 1 to 5 nm for example) and vice versa. The material of the protective layer is chosen in such a way as to have etching selectivity with respect to the material of the masking layer. The protective layer, because of its very small thickness, will be substantially transparent during the implantation.

For example, SiOx can be etched selectively with respect to nitride via vapour HF etching, SiNy can be etched selectively with respect to oxide via etching using H3PO4.

Thus, the material of the protective layer is chosen in such a way as to prevent or to reduce vertical consumption of the hard mask during the step of enlarging the pattern formed in the hard mask.

During the creation of the pattern, both the masking layer and the protective layer are etched. Then, for the lateral etching steps, only the masking layer is etched. the protective layer thus forming a slight overhand that does not disturb the lateral etching "under" the protective layer.

As indicated above, the invention is particularly advantageous if the layer 410 to be etched is made of silicon or from one of the following materials: silicon germanium, germanium, silicon nitride, sapphire, quartz.

According to yet another embodiment, the layer to be etched is made of carbon-doped hydrogenated silicon oxide (SiOCH). This can be porous or dense SiOCH. This material has the advantage of having a very low permittivity, in particular when it is porous.

All the embodiments described above can be applied to SiOCH. The main steps of a particularly advantageous embodiment will be described below.

1. Stack: A layer of resin forming the masking layer 420 is deposited on a layer 410 of SiOCH to be etched. Between the masking layer 420 and the layer 410 of SiOCH to be etched, a protective layer is formed, for example an oxide (SiO2) or a nitride (SiN). This protective layer is used to facilitate the lithography as will be explained below. It also allows the SiOCH to be protected during the implantation since this material has a low density it is easily atomised during the implantation.

2. Lithography: a step of nanoimprint lithography (NIL) is carried out. This technique is a good alternative to the conventional lithography methods. Nevertheless, one of the disadvantages of this technique is that it does not allow the patterns of the mould to reach the SiOCH/resin interface during the pressing. Indeed, a residue of resin remains at the bottom of the patterns. Moreover, the use of dry etching to open the residual resin leads to modifications of dimensions of the initial patterns. Here, the residual thickness of the residue at the bottom of a pattern is not an obstacle since the implantation passes through it in order to reach the target material. Moreover, as has been described above, this residue of resin, correctly sized in terms of thickness, forms a buffer layer allowing the atoms of carbon that are torn from the surface of the layer of resin and that have a tendency to penetrate the layer 410 of SiOCH to be etched to be stopped.

3. Implantation: The implantation can be carried out in ion beam or plasma immersion ion implantation equipment. The energy and the implantation dose are defined according to the desired profile and depth. Simulations on a Crystal TRansport of Ions in Mater (C-trim) applet allow the depth of implantation in the materials to be predicted.

The ion implantation leads to modifications in the material, in particular the breaking of certain bonds. Under the effect of the implantation, the SiOCH loses its methyl groups and tends to a structure close or similar to that of an SiO2. This allows high selectivity during the wet etching to be created.

In the context of the present invention, it has been noted that regardless of the species of the ion implanted, an atomisation of the SiOCH takes place. The integration of the protective layer cited above thus becomes particularly advantageous.

In the context of the development of the present invention, Hydrogen turned out to be particularly advantageous. Indeed, hydrogen allows very high selectivity to be obtained when other species such as Argon show "infinite" resistance to wet etching with HF.

Figure 10:
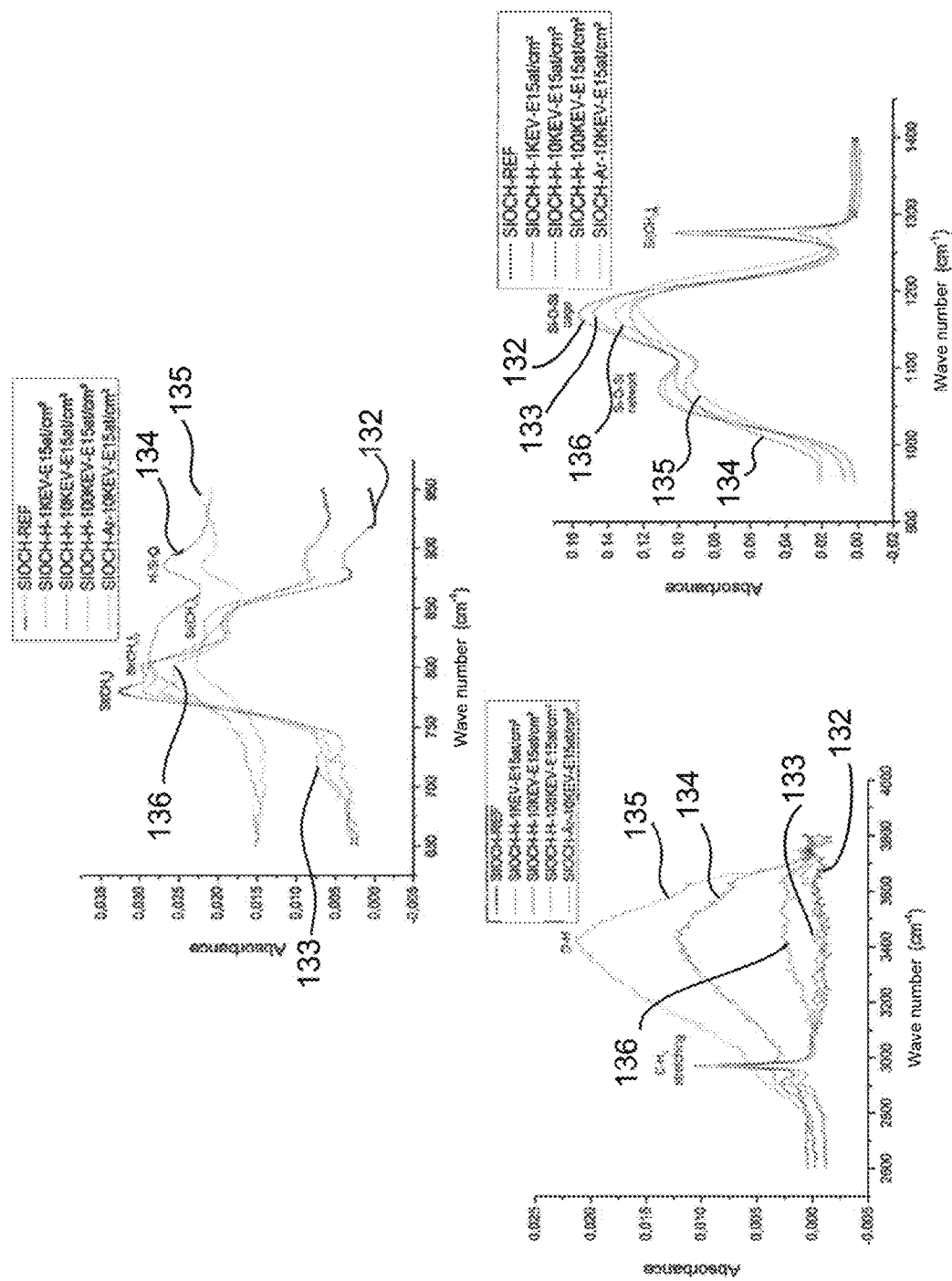
FIG. 10 illustrates the structure of the SiOCH after the implantation of H and Ar.

FIG. 10 illustrates the structure of the SiOCH after the implantation of H and Ar. While the dose is always maintained at $1.E15$ at/cm$^2$, three energies are tested for the Hydrogen 1 kev, 10 kev, and 100 kev, and one for the Argon: 10 kev.

In FIG. 10, the curve 132 corresponds to reference SiOCH that is to say non-implanted SiOCH; the curve 133 corresponds to SiOCH implanted with hydrogen ions and an energy of 1 keV; the curve 134 corresponds to SiOCH implanted with hydrogen ions and an energy of 10 keV; the curve 135 corresponds to SiOCH implanted with hydrogen ions and an energy of 100 keV; the curve 136 corresponds to SiOCH implanted with argon ions and an energy of 10 keV.

In the case of the H, the appearance of the O—H bond (band 2800-3800 cm-1) after implantation is observed which corresponds to the material taking in water, the SiOCH changes from a hydrophobic material to a hydrophilic material. The intake of water remains low for Argon which explains its resistance to wet etching with HF.

The rupture of the methyl groups and the formation of the Si—O bonds are also observed.

After a first implantation, the pattern is enlarged. For this, reference is made to the explanations mentioned in the preceding embodiments. This step of trimming allows an additional surface of the protective layer to be exposed.

After this enlargement, a new implantation is carried out in order to modify the SiOCH vertically in line with the portion in which the masking layer was removed during the enlargement. The SiOCH is thus modified over a greater surface area. The implantation depth is less than in the previous implantation step.

This sequence comprising the step of enlargement and the step of modification via implantation can be repeated numerous times.

4. Removal of the masking layer: This removal is carried out after the last sequence comprising the step of enlargement and the step of modification via implantation. The removal of the resin can be carried out via a wet or dry process. During this step, the protective layer advantageously protects the SiOCH.

5. Etching of the modified SiOCH: This etching step is preferably carried out with a solution of HF diluted to 1%. As explained above, the implantation generates modifications in the SiOCH that manifest themselves as the hydrophilisation of the material, the rupture of the methyl groups and finally the formation of the Si—O bonds. This provides infinite selectivity with respect to the non-modified zone up to an etching time of less than 240.

This step also allows the protective layer, for example made of SiN or SiO2, to be removed.

The technique described above for texturing SiOCH has several advantages:
- The mask is not metallic but organic which confers numerous advantages in terms of method.
- The nanoimprint lithography used to create the pattern is not very costly and is accurate. Moreover, the resin residue at the bottom of the pattern can act as a buffer layer for protecting the layer of SiOCH against the undesired addition of carbon during the implantation as has been described above. Moreover, it protects the SiOCH during the removal of the resin.
- The etching is carried out via a wet process According to an alternative embodiment, the removal of the masking layer made of resin can be carried out during the step of wet etching with an HF solution, in particular if a resin containing Silicon such as Hydrogen silsesquioxane (HSQ) is used.

Moreover, any other lithography technique can be used to pattern the resin.

In light of the preceding description, it is clear that the invention proposes a simple, reliable and easily industrialisable solution for creating possibly complex profiles that require a plurality of operations of lithographies to be aligned.

The invention is not limited to the embodiments described above and extends to al the embodiments covered by the claims.

The invention claimed is:

1. A method for creating patterns in a layer to be etched, starting from a stack comprising at least the layer to be etched and a masking layer on top of the layer to be etched, the masking layer having at least one pattern, the method comprising:
   a) modifying at least one zone of the layer to be etched via ion implantation vertically in line with said at least one pattern of said masking layer;
   b) at least one sequence of b1) and b2):
      b1) enlarging said at least one pattern of said masking layer, said masking layer having been preserved after the modification in order to carry out the enlargement, the enlarging being carried out in such a way as to enlarge said at least one pattern in a plane in which the layer to be etched mainly extends;
      b2) modifying at least one zone of the layer to be etched via ion implantation vertically in line with the at least one enlarged pattern of said masking layer, the implantation being carried out over a depth less than the implantation depth of the preceding modification; and
   c) removing the modified zones, the removal comprising etching the modified zones selectively with respect to the non-modified zones of the layer to be etched, said etching being wet etching,
   wherein the masking layer is a hard mask or the stack comprises a buffer layer positioned between the masking layer and the layer to be etched and covering the layer to be etched during the implantation.

2. The method according to claim 1, wherein the etching uses a solution of tetramethylammonium hydroxide or hydrofluoric acid (HF).

3. The method according to claim 1, wherein the stack comprises a buffer layer positioned between the masking layer and the layer to be etched and covering the layer to be etched during the implantation.

4. The method according to claim 3, wherein the buffer layer is made of at least one material selected from the group consisting of SixOy, SiOx, SixNy, SiNx, TiN, and SiARC.

5. The method according to claim 3, wherein a material of the masking layer and a material of the buffer layer are different and wherein the enlarging of the at least one pattern of the masking layer comprises a selective etching of the masking layer with respect to the buffer layer, the main direction of which is parallel to a plane in which the layer to be etched mainly extends.

6. The method according to claim 3 wherein the masking layer and the buffer layer are made of at least one resin.

7. The method according to claim 6, wherein the buffer layer forms a residue of the at least one resin at a bottom of the pattern of the masking layer.

8. The method according to claim 1, wherein the masking layer comprises carbon and wherein the thickness of the buffer layer, after the enlargement and before the implantation, is sufficient to form a barrier that prevents, during said implantation, carbon coming from the masking layer from penetrating into the layer to be etched.

9. The method according claim 1, wherein the thickness of the buffer layer, after the enlargement and before the implantation, is at least 10nm.

10. The method according to claim 1, wherein the masking layer is a layer of at least one resin.

11. The method according to claim 1, wherein the masking layer is a layer forming a hard mask.

12. The method according to claim 11, wherein the masking layer is positioned directly in contact with the layer to be etched and wherein the enlarging of the at least one pattern of the masking layer comprises a selective etching of the masking layer with respect to the layer to be etched, the etching being anisotropic etching.

13. The method according to claim 11, wherein a material of the hard mask is at least one selected from the group consisting of SiOx, SiNy, SiARC, and TiN.

14. The method according to claim 11, wherein, before the ion implantation, the layer to be etched is exposed vertically in line with the at least one enlarged pattern.

15. The method according to claim 11, wherein at least one protective layer is placed on the masking layer, the material of the protective layer being chosen in such a way as to prevent or reduce vertical consumption of the hard mask during the step of enlarging of the pattern formed in the hard mask.

16. The method according to claim 1, wherein the implantation is carried out with an implanter.

17. The method according to claim 16, wherein a thickness of the buffer layer is adjusted in such a way that, in the modified zones, the ions are implanted continuously starting from the surface of the layer to be etched.

18. The method according to claim 1, wherein the implantation is carried out in a plasma reactor.

19. The method according to claim 1, wherein, before the removing of the modified zones c), said sequence of b1) and b2) is carried out multiple times.

20. The method according to claim 1, wherein in b) and c), the enlarging of the at least one pattern and the implantation depth are selected in such a way that the modified zones form a profile in a shape of steps of a staircase.

21. The method according to claim 20, wherein, after etching a profile in the shape of steps of a staircase in the layer to be etched, said profile is smoothed by oxidation and deoxidation of a material of a substrate.

22. The method according to claim 1, wherein a profile is the negative of a shape of an aspherical lens.

23. The method according to claim 1, wherein a profile forms a mould configured to penetrate an imprintable resin in order to transfer the profile into it via nanoimprinting.

24. The method according to claim 1, wherein, before a) to c), the masking layer comprises a plurality of patterns and wherein a) to c) are applied to said plurality of patterns.

25. The method according to claim 1, wherein, before a) to c), the masking layer comprises a plurality of patterns forming openings in a thickness of the masking layer and wherein the enlargement is carried out in such a way as to remove a material of the masking layer separating at least two patterns, in such a way as to make these at least two patterns connected after the enlargement.

26. The method according to claim 25, wherein a profile obtained at the end of the method is a dual damascene structure.

27. The method according to claim 1, wherein, before a) to c), the masking layer comprises a plurality of patterns for forming interconnection vias, wherein the enlargement is carried out in such a way as to connect at least some of the interconnection vias.

28. The method according to claim 27, wherein a profile formed in the layer to be etched is then transferred into an underlying layer covered by the layer to be etched, the layer to be etched acting as a hard mask during the transfer of the profile into the underlying layer.

29. The method according to claim 28, comprising filling the obtained profile with a metal.

30. The method according to claim 1, wherein the layer to be etched is a layer or a substrate, a material of which is selected from the group consisting of silicon, silicon germanium, germanium, silicon nitride, sapphire, and quartz.

31. The method according to claim 1, wherein the layer to be etched is a layer or a substrate made of SiOCH.

32. The method according to claim 31, wherein a protective layer is located on top of the layer to be etched made of SiOCH, between the masking layer and the layer to be etched.

33. The method according to claim 32, wherein, during the implantation, the protective layer is, vertically in line with the pattern, covered with a residue of the masking layer forming the buffer layer, a thickness of which is smaller than a thickness of the masking layer outside of the pattern.

34. The method according claim 1, wherein the layer to be etched is a crystalline layer.

* * * * *